(12) United States Patent
Kim

(10) Patent No.: US 8,507,374 B2
(45) Date of Patent: Aug. 13, 2013

(54) SEMICONDUCTOR DEVICE WITH VERTICAL GATE AND METHOD FOR MANUFACTURING THE SAME

(75) Inventor: Seung Hwan Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 166 days.

(21) Appl. No.: 12/969,537

(22) Filed: Dec. 15, 2010

(65) Prior Publication Data

US 2012/0025296 A1    Feb. 2, 2012

(30) Foreign Application Priority Data

Aug. 2, 2010 (KR) ............. 10-2010-0074635

(51) Int. Cl.
*H01L 27/108* (2006.01)
*H01L 21/28* (2006.01)

(52) U.S. Cl.
USPC .................................. 438/591; 257/324

(58) Field of Classification Search
USPC ............ 438/212, 591, 696; 257/324, 329, 257/635, E21.19, E23.116, E23.168, E27.048; 977/888
See application file for complete search history.

(56) References Cited

U.S. PATENT DOCUMENTS

| 7,838,925 | B2 * | 11/2010 | Roesner et al. | 257/328 |
| 2002/0066925 | A1 | 6/2002 | Gruening et al. | |
| 2010/0285645 | A1 * | 11/2010 | Yoon et al. | 438/268 |
| 2012/0126301 | A1 * | 5/2012 | Kunkel et al. | 257/306 |
| 2012/0270374 | A1 * | 10/2012 | Masuoka et al. | 438/268 |

FOREIGN PATENT DOCUMENTS

| KR | 1020040048949 A | 6/2004 |
| KR | 1020060041415 A | 5/2006 |

* cited by examiner

*Primary Examiner* — Hsien Ming Lee
*Assistant Examiner* — Walter H Swanson

(57) ABSTRACT

A semiconductor device and a method for manufacturing the same are disclosed. The method for manufacturing the semiconductor device comprises: forming a plurality of first pillar patterns each of which includes a sidewall contact by selectively etching a semiconductor substrate; forming a buried bit line at a lower portion of a region between two neighboring first pillar patterns; forming a plurality of second pillar patterns by selectively etching upper portions of the first pillar patterns; and forming a gate coupling second pillar patterns arranged in a direction crossing the bit line, the gate enclosing the second pillar patterns.

15 Claims, 13 Drawing Sheets

SEMICONDUCTOR DEVICE WITH VERTICAL GATE AND METHOD FOR MANUFACTURING THE SAME

CROSS-REFERENCE TO RELATED APPLICATION

The priority of Korean patent application No. 10-2010-0074635 filed on 2 Aug. 2010, the disclosure of which is hereby incorporated in its entirety by reference, is claimed.

BACKGROUND OF THE INVENTION

Embodiments of the present invention relate to a semiconductor device and a method for manufacturing the same, and more particularly to a semiconductor device including a vertical gate and a method for manufacturing the same.

As the integration degree of a semiconductor device is increased, a channel length of a transistor is gradually decreased. However, the reduction in channel length of the transistor encounters a drain induced barrier lowering (DIBL) phenomenon, a hot carrier effect, and a short channel effect such as punch-through. In order to solve such problems, a variety of methods are being intensively researched by many developers and companies. For example, the methods include a method for reducing a depth of a junction region, a method for relatively increasing a channel length by forming a recess in a channel region of a transistor, and the like.

However, as the integration density of a semiconductor memory device (especially, dynamic random access memory (DRAM)) has come close to gigabits, it is necessary to manufacture a smaller-sized transistor. In other words, the giga-bit semiconductor device requires a DRAM transistor having a device area of less than 8F2, F representing a minimum feature size and even having a device area of about 4F2. Therefore, in the case of a planer transistor in which a gate electrode is formed over a semiconductor substrate and a junction region is formed at both sides of the gate electrode, it is difficult to satisfy the above device area. In order to solve the above-mentioned problems, a vertical channel transistor has been recently proposed.

In accordance with the vertical channel transistor, a buried bit line is formed, and a pillar pattern for forming a vertical gate is then formed. When the pillar pattern is formed, other materials (e.g., a nitride film, an oxide film, etc.) should be etched. In this case, there arises a skirt phenomenon in which a nitride film formed on a back side of the pillar pattern is not sufficiently etched.

BRIEF SUMMARY OF THE INVENTION

Various embodiments of the present invention are directed to providing a semiconductor device and a method for manufacturing the same that substantially obviate one or more problems due to limitations and disadvantages of the related art.

An object of the present invention is to provide a semiconductor device including a vertical gate and a method for manufacturing the same.

In accordance with an aspect of the present invention, a plurality of first pillar patterns each of which includes a sidewall contact; a buried bit line disposed in a first direction at a lower portion of a region between two neighboring first pillar patterns; and a gate coupling second pillar patterns arranged in a second direction that intersects the first direction, the gate enclosing the second pillar patterns, wherein a plurality of second pillar patterns is disposed on a corresponding one of the first pillar patterns.

The bit line may include tungsten or polysilicon.

The bit line and the gate may be perpendicular to each other. The gate may be disposed over the bit line. The gate may include titanium nitride (TiN), tungsten, or a combination thereof.

In accordance with another aspect of the present invention, A method for manufacturing a semiconductor device, the method comprising: forming a plurality of first pillar patterns each of which includes a sidewall contact by selectively etching a semiconductor substrate; forming a buried bit line at a lower portion of a region between two neighboring first pillar patterns; forming a plurality of second pillar patterns by selectively etching upper portions of the first pillar patterns; and forming a gate coupling second pillar patterns arranged in a direction crossing the bit line, the gate enclosing the second pillar patterns.

The forming of the first pillar patterns includes: etching the semiconductor substrate in a line shape.

Further comprising: forming a barrier metal layer over the first pillar patterns and the semiconductor substrate.

The forming of the buried bit line includes: forming a bit line conductive layer over the semiconductor substrate including the first pillar patterns; and performing an etch-back process on the bit line conductive layer so that the bit line conductive layer remains at the lower portion of the region between the two neighboring first pillar patterns. The forming of the bit line conductive layer uses a material including tungsten or polysilicon, or both.

Forming a capping layer over the first pillar patterns and the buried bit line; burying a first oxide layer over the buried bit line arranged between the two neighboring first pillar patterns; removing the capping layer formed over sidewalls of the first pillar patterns; burying a second oxide layer in a space where the capping layer is removed; exposing the top surface of the first pillar patterns by recessing the first and second oxide layers; and forming a nitride layer over the exposed first pillar patterns and the first and second oxide layers.

The capping layer includes a nitride layer.

The first or second oxide layer comprises a spin on dielectric (SOD) material.

The forming of the second pillar patterns includes: forming a mask pattern crossing the buried bit line over the first pillar patterns; and selectively etching the nitride layer, the first and second oxide layer, and the first pillar patterns using the mask pattern as an etch mask.

The mask pattern is formed perpendicular to the buried bit line.

The forming of the gate includes: removing the first and second oxide layers remaining in a space between the second pillar patterns; forming a gate conductive layer over a structure where the first and second oxide layers are removed; removing the gate conductive layer disposed between nitride patterns formed by selectively etching the nitride layer; forming a spacer over sidewalls of the nitride patterns; and etching the gate conductive layer using the spacer and the nitride patterns as a mask.

Further comprising: forming a gate insulation layer over sidewalls of the second pillar patterns.

The gate conductive layer includes titanium nitride (TiN), tungsten, or a combination thereof.

The tungsten is processed by using a source gas selected from a group consisting of $WF_6$, $B_2BH_6$, $H_2$, $SiH_4$, and a combination thereof and a thermal processing chemical vapor deposition (CVD) device.

The titanium nitride (TiN) layer is processed using a source gas selected from a group consisting of TiCl$_4$, TDMAT (Ti(N[CH$_3$]$_2$)$_4$), and a combination thereof.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the accompanying drawings.

Figure 1:
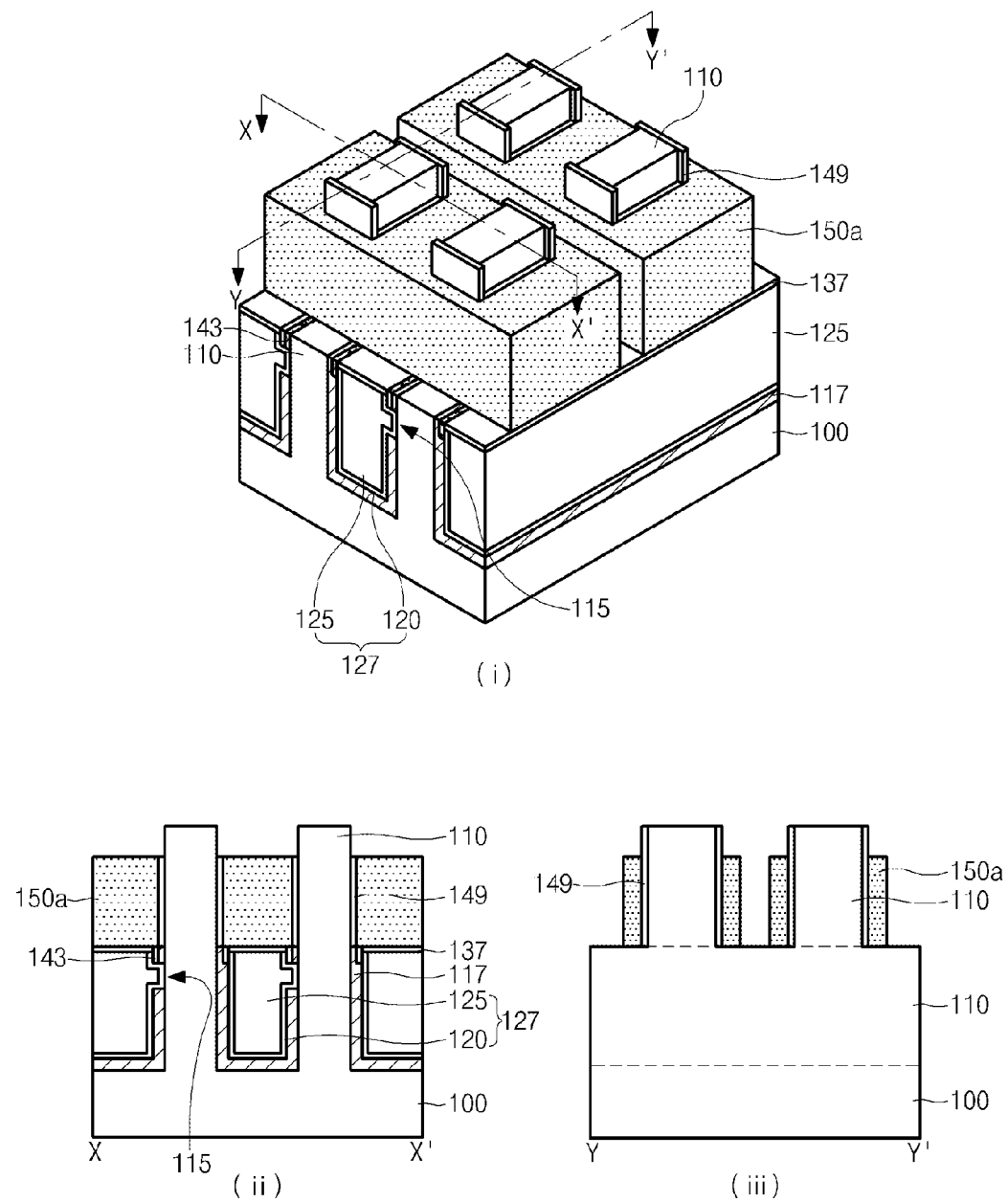
FIG. 1 illustrates a semiconductor device according to an embodiment of the present invention.

FIG. 1 shows a semiconductor device including a buried bit line and a gate according to the present invention. In FIG. 1, (i) is a cross-sectional view illustrating the semiconductor device, (ii) is a cross-sectional view illustrating the semiconductor device taken along a line X-X' shown in (i), and (iii) is a cross-sectional view illustrating the semiconductor device taken along a line Y-Y' shown in (i).

Referring to FIG. 1, several pillar patterns 110 including a sidewall contact 115 are formed over a semiconductor substrate 100. In this case, an upper portion of the pillar pattern 110 may be exposed like an island. A buried bit line 127 is located at a lower portion of a region between the pillar patterns 110. The buried bit line 127 may include a barrier metal layer 120 and a bit line conductive layer 125, and may be formed in a line shape extended in the Y-Y' direction.

In addition, a gate 150a is formed over the buried but line 127 and the pillar pattern 110. The gate 150a is formed to interconnect the pillar patterns 110 arranged along the X-X' direction crossing the bit line 127. In addition, the gate 150a is formed to enclose the pillar patterns 110. In this case, the gate 150a may be formed of titanium nitride, tungsten, or a combination thereof. A gate insulation layer 149 is formed at an interface between the gate 150a and the pillar pattern 110.

In this way, the vertical gate is formed as a gate structure, so that gate control capability of the semiconductor device can be improved.

Figure 2A:
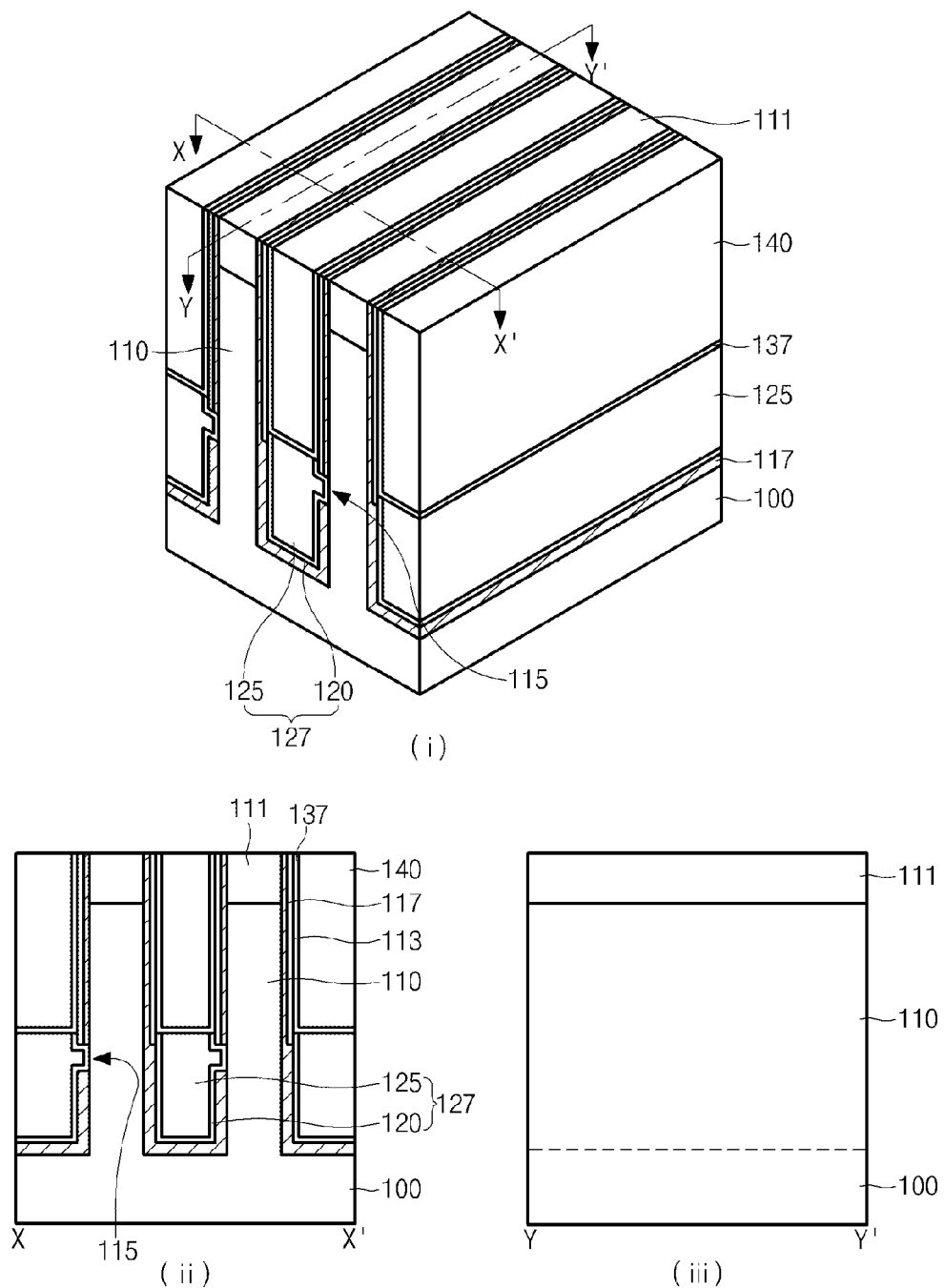
FIGS. 2A to 2L are perspective and cross-sectional views illustrating a semiconductor device according to an embodiment of the present invention.

FIGS. 2A to 2L show a method for manufacturing a semiconductor device according to the present invention. In each of FIGS. 2A to 2L, (i) is a perspective view illustrating the semiconductor device, (ii) is a cross-sectional view illustrating the semiconductor device taken along a line X-X' of (i), and (iii) is a cross-sectional view illustrating the semiconductor device taken along a line Y-Y' of (i). Referring to FIG. 2A, a mask pattern 111 for defining a buried bit line is formed over a semiconductor substrate 100. In this case, the mask pattern 111 may be formed in a line shape, and be formed of a material including nitride.

Subsequently, the semiconductor substrate 100 is etched using the mask pattern 111 as an etch mask, so that a plurality of pillar patterns 110 are formed. The pillar patterns 110 are extended in a Y-Y' direction by partially etching the semiconductor substrate 100. Afterwards, a first nitride layer 113 and a first oxide layer 117 to define a sidewall contact 115 are formed over the semiconductor substrate 100 including the pillar patterns 110 and the mask pattern 111. The sidewall contact 115 may be formed as a single sidewall contact (also called 'one side contact') formed at only one sidewall of each of the pillar patterns 110. Subsequently, a barrier metal layer 120 is deposited over the entire surface of the semiconductor substrate 100 including the pillar patterns 110 where the sidewall contact 115 is formed. The barrier metal layer 120 may be formed of titanium (Ti), titanium nitride (TiN), or a combination thereof.

Afterwards, a bit line conductive layer 125 is formed over the semiconductor substrate 100 where the barrier metal layer 120 is formed to thereby fill a region between two neighboring pillar patterns 110. The bit line conductive layer 125 may be formed of a material including tungsten or polysilicon. Subsequently, the bit line conductive layer 125 is etched by an etch-back process, so that the bit line conductive layer 125 remains only at a lower portion of the region between the two neighboring pillar patterns 110. In this case, when the bit line conductive layer 125 is etched back, the barrier metal layer 120 is also etched to the same height as that of the bit line conductive layer 125. A structure including the bit line conductive layer 125 and the barrier metal layer 120 is hereinafter referred to as a buried bit line 127.

A second nitride layer 137 is deposited over the pillar pattern 110 and the buried bit line 127. The second nitride layer 137 is used as a capping layer for protecting the buried bit line 127. A second oxide layer 140 is formed over the entire surface on which the second nitride layer 137 is deposited, and is planarized until the mask pattern 111 is exposed. As a result, the second oxide layer 140 remains over the buried bit line 127 formed in the region between the neighboring pillar patterns 110. The second oxide layer 140 may be formed of poly silazane (PSZ). The PSZ layer serving as a capping oxide layer includes a lot of amine components, and may be formed by wet annealing at high pressure and high temperature under H$_2$O environments.

Figure 2B:
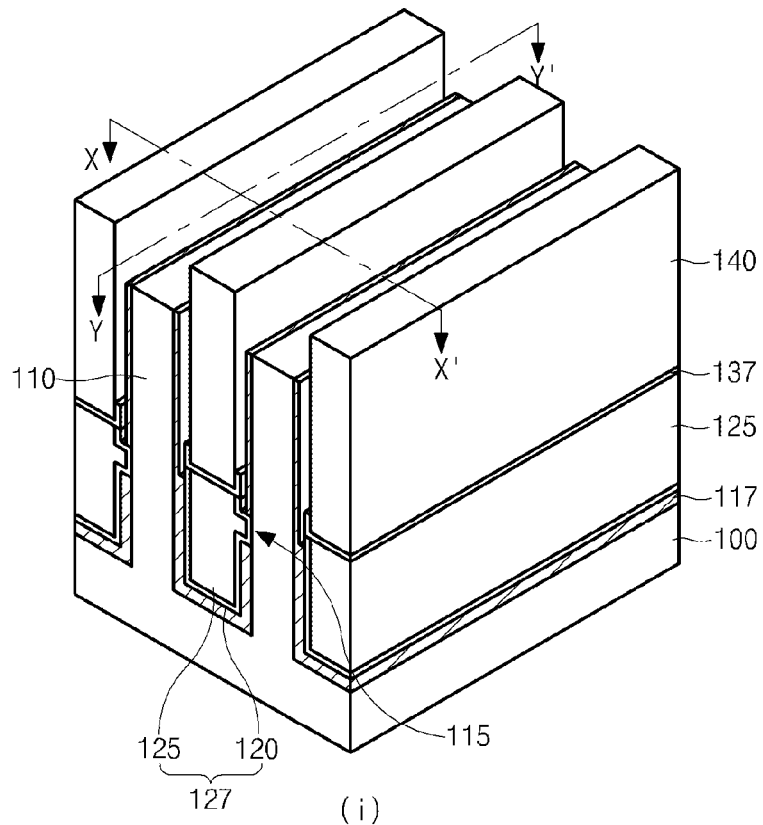
Figure 2B:
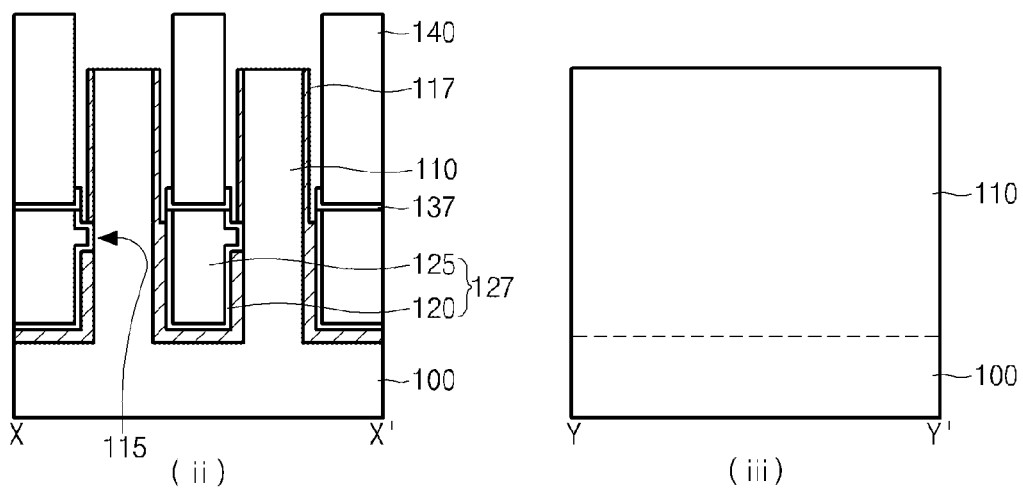

Referring to FIG. 2B, the exposed second nitride layer 137 is removed. In this case, the first nitride layer 113 and the mask pattern 111 formed of the nitride are also removed together with the second nitride layer 137. A process for removing the nitride layers may be carried out by a wet cleaning process. In this process, the nitride layers are not completely removed, and some parts of the nitride layers remain at the bottom of sidewalls of the second oxide layer 140.

Figure 2C:
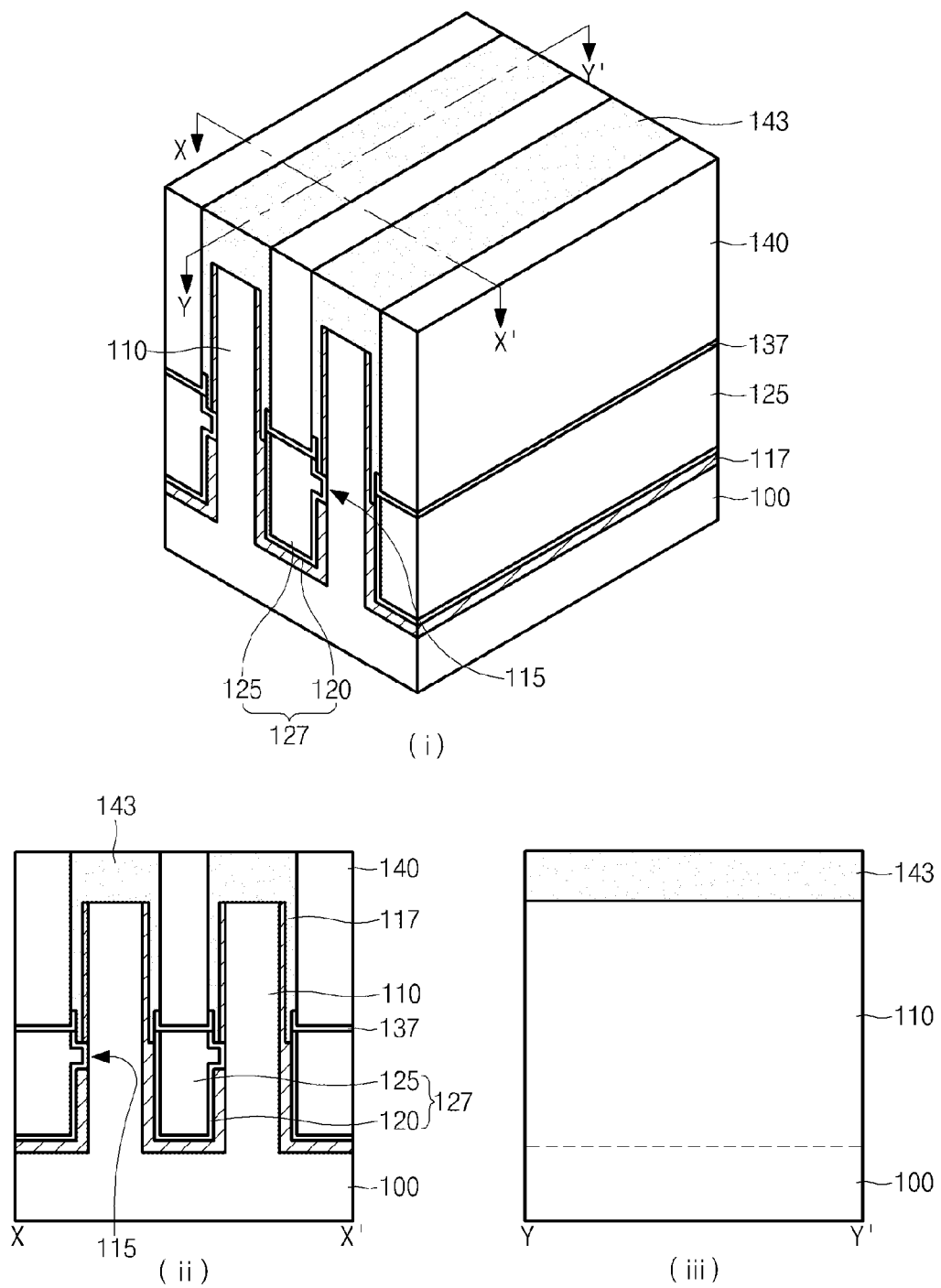

Referring to FIG. 2C, a third oxide layer 143 is formed to fill a specific region from which the mask pattern 111, the first nitride layer 113, and the second nitride layer 137 are removed. In this case, the third oxide layer 143 may be formed of a spin in dielectric (SOD) layer having superior burying characteristics. The third oxide layer 143 is then planarized. The third oxide layer 143 may be etched to have a thickness of 200 Å~300 Å with respect to the top surface of the pillar pattern 110. The third oxide layer 143 may be formed of poly silazane (PSZ) in the same manner as in the second oxide layer 140, and may be formed by wet annealing at a temperature of 300° C.~400° C.

Figure 2D:
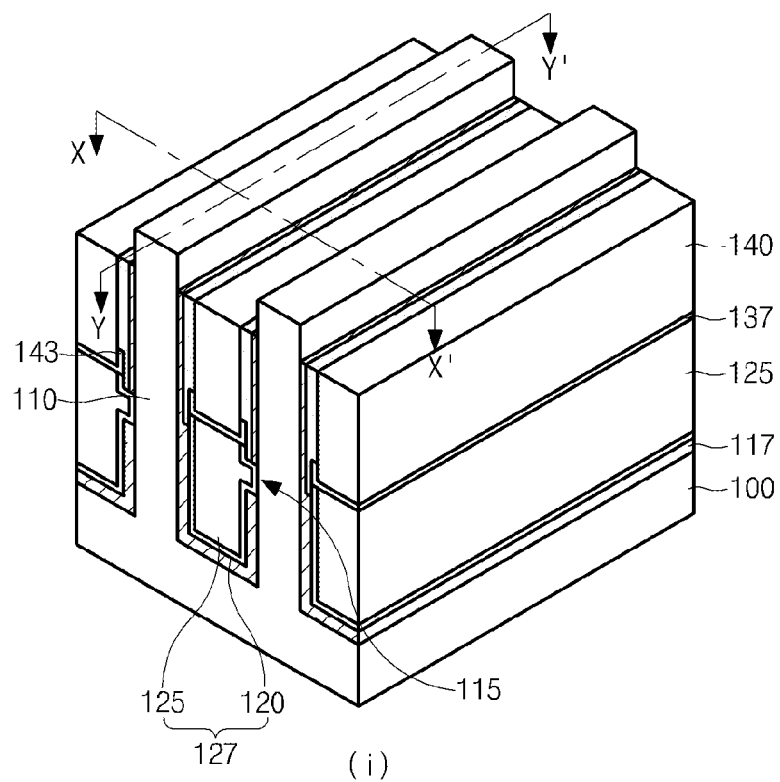
Figure 2D:
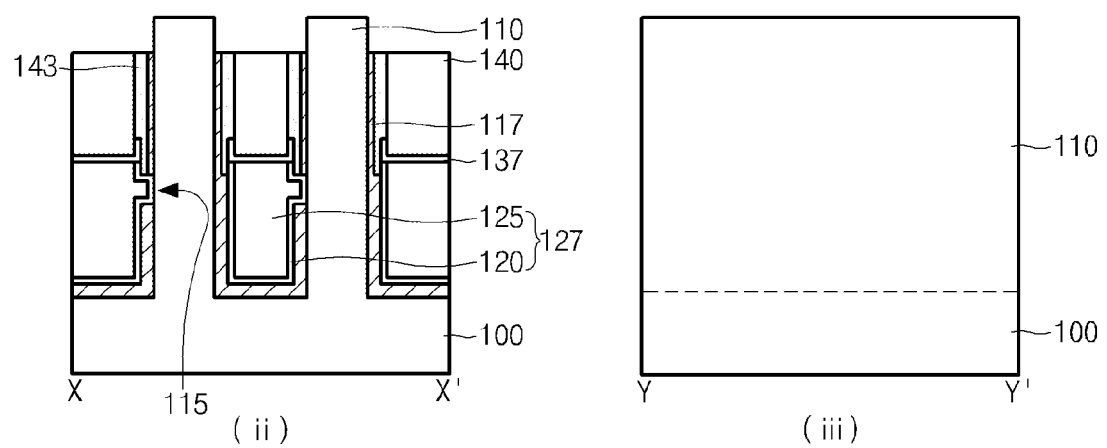

Referring to FIG. 2D, the third oxide layer 143 and the second oxide layer 140 are recessed until the top surface of the pillar pattern 110 is exposed. In this case, the third oxide layer 143 may be recessed to define a depth of 200 Å~300 Å with respect to the top surface of the pillar pattern 110. That is, the top surface of the pillar pattern 110 protrudes over the top surface of the third oxide layer 143.

Figure 2E:
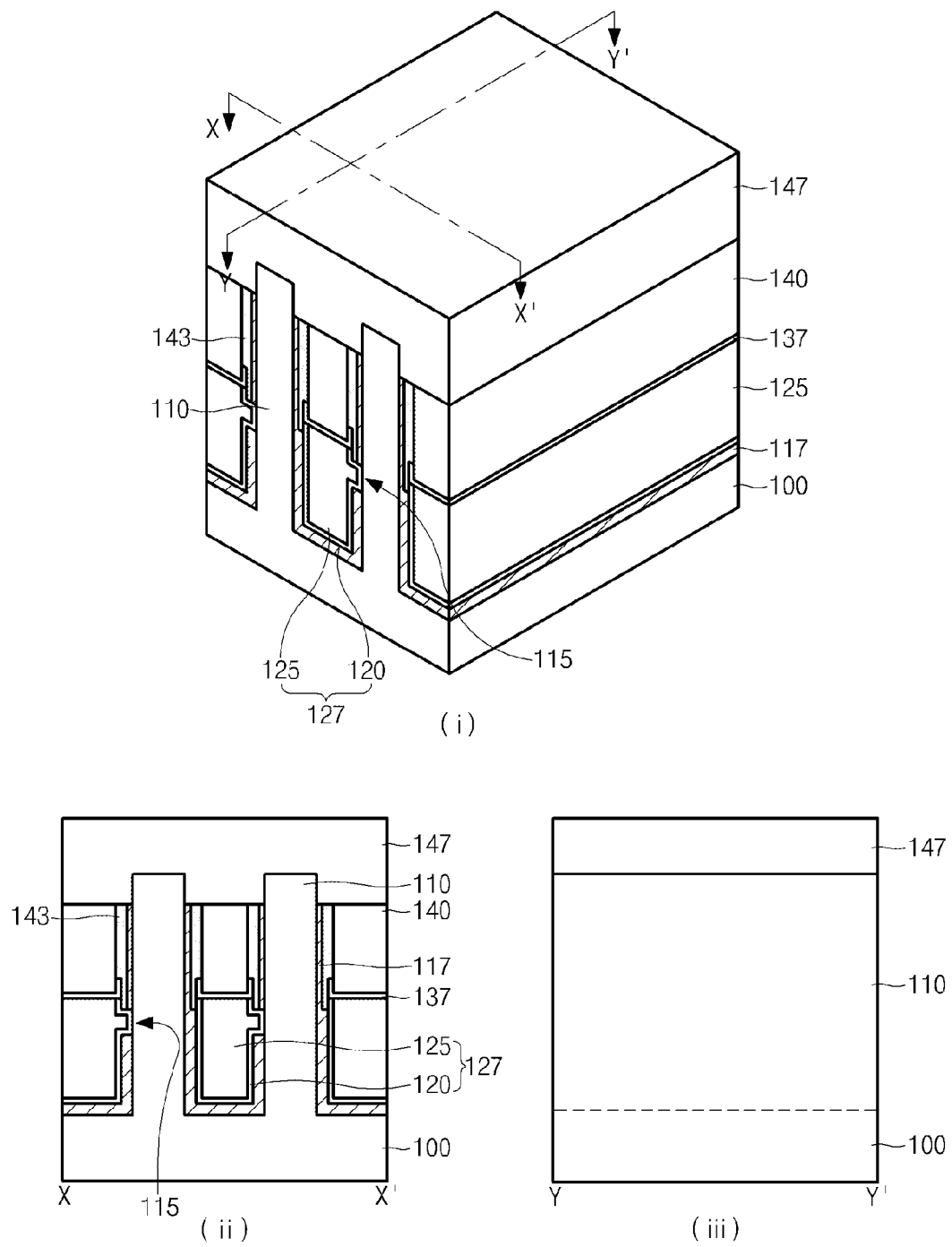

Referring to FIG. 2E, a third nitride layer 147 is formed over the pillar pattern 110 and the third oxide layer 143.

Afterwards, the third nitride layer 147 is planarized. In this case, the planarized third nitride layer 147 may have a thickness of 150 Å~200 Å.

Figure 2F:
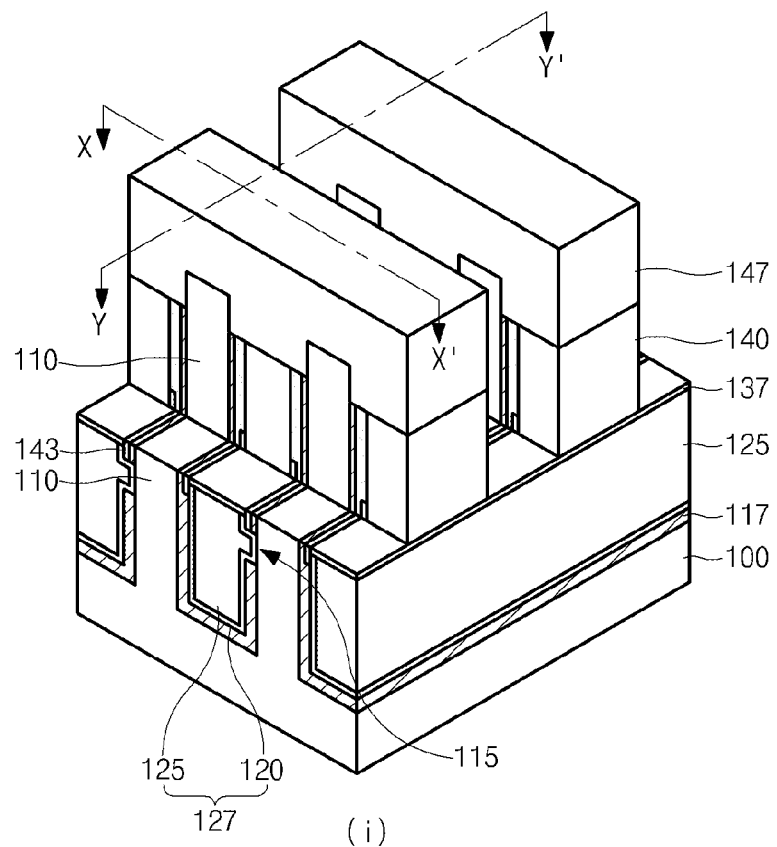
Figure 2F:
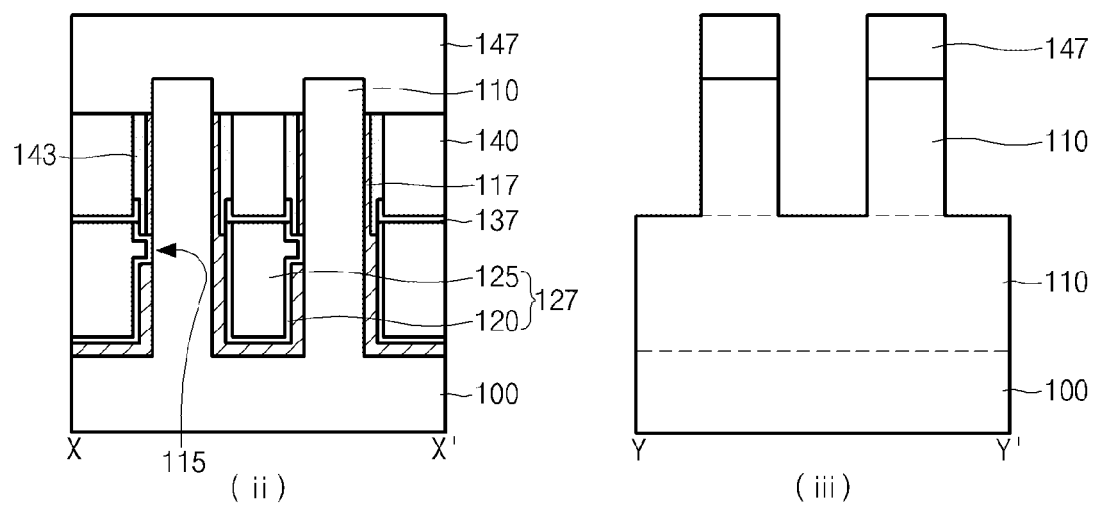

Referring to FIG. 2F, a mask pattern (not shown) for defining a vertical gate is formed over the third nitride layer 147. The mask pattern (not shown) for defining the vertical gate is formed in a line shape, and is extended in the X-X' direction crossing the buried bit line 127. Thereafter, the third nitride layer 147, the third oxide layer 143, and the second oxide layer 140 are etched using the mask pattern (not shown) as an etch mask. In this case, the pillar pattern 110 and the first oxide layer 117 formed on the sidewalls of the pillar pattern 110 are etched together. The etching process is carried out until the second nitride layer 137 formed over the buried bit line 127 is exposed.

Figure 2G:
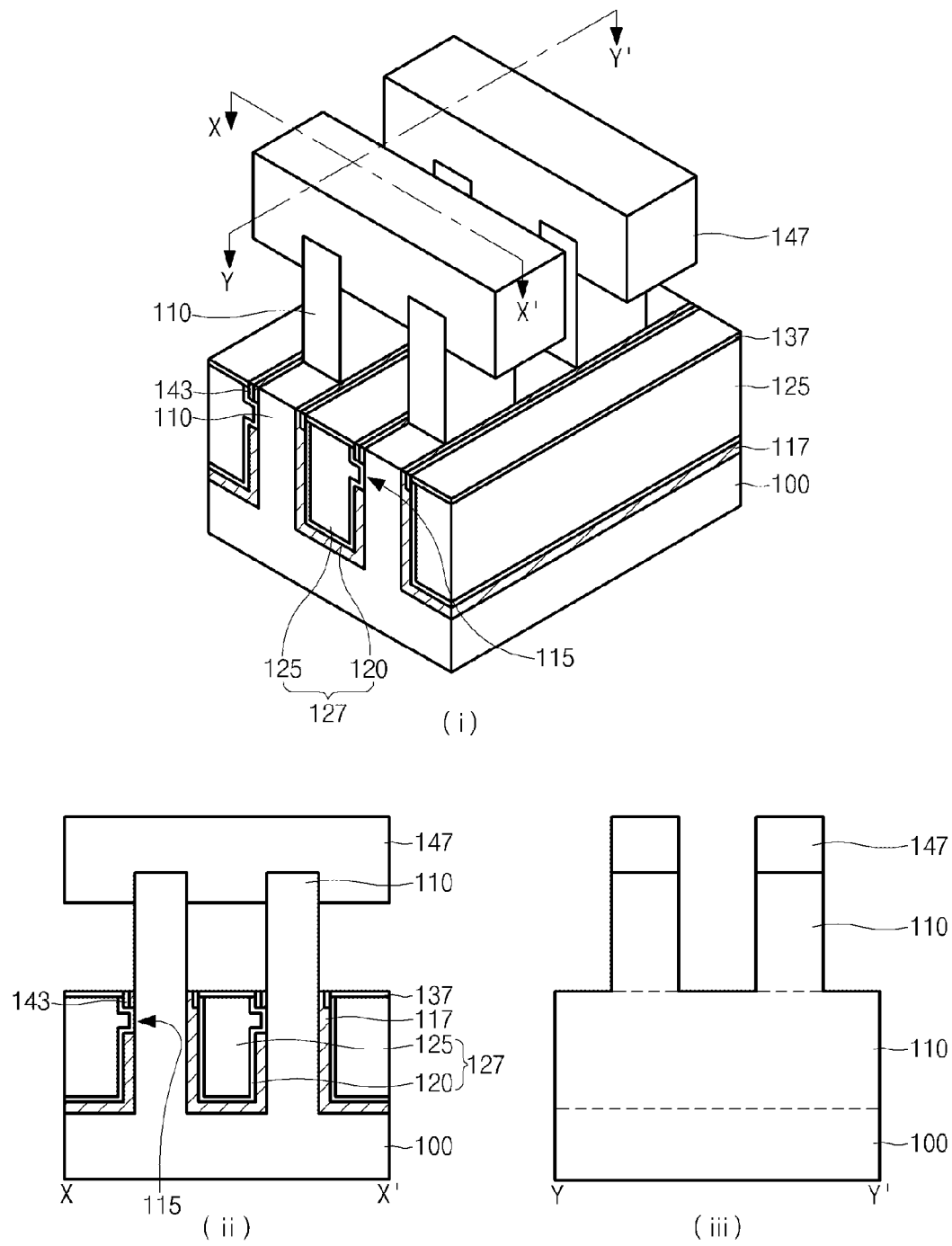

Referring to FIG. 2G, portions of all oxide layers enclosing the pillar pattern 110 are removed. In this case, the oxide layers may include the third oxide layer 143, the second oxide layer 140, and the first oxide layer 117. In this case, the oxide layers may be removed by a wet solution provided through the exposed portions. In this case, the third nitride layer 147 may support lower pillar pattern 110.

Figure 2H:
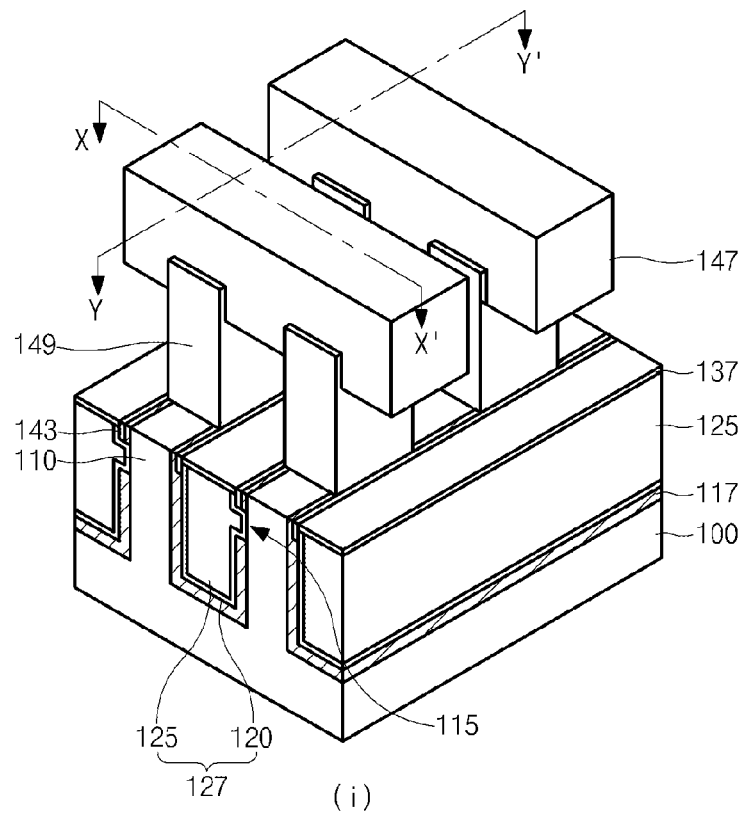
Figure 2H:
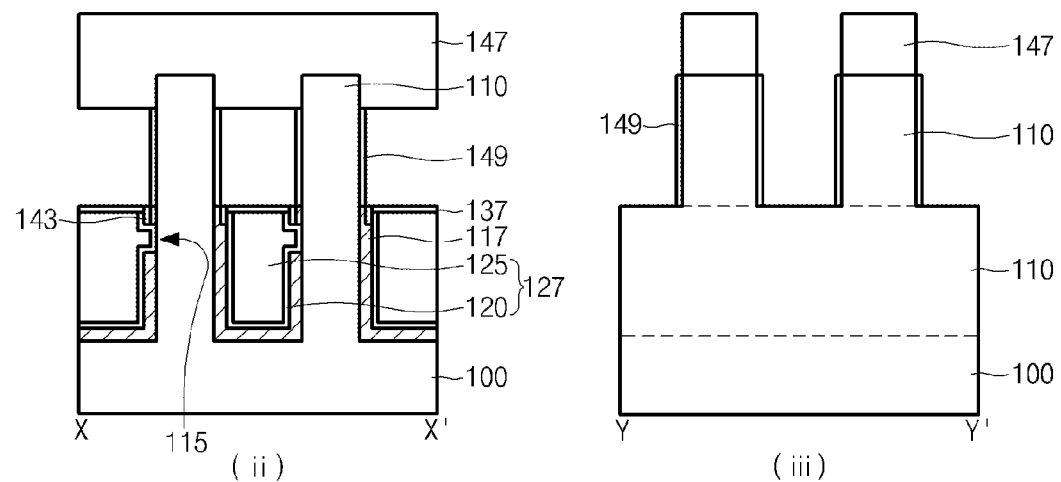

Referring to FIG. 2H, a fourth oxide layer 149 is formed on exposed portions of the sidewalls of the pillar pattern 110. The fourth oxide layer 149 may be formed of a radical oxide layer or a plasma oxide layer. The radical oxide layer may be formed by an oxidation process based on radical oxygen, and this oxidation process can acquire a superior oxide layer at a relatively low temperature.

Figure 2I:
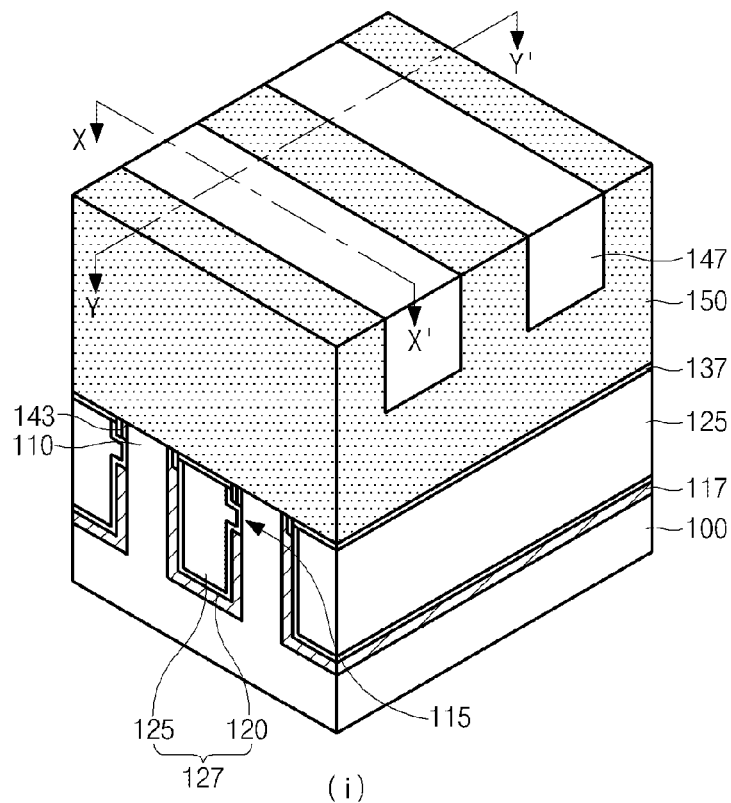
Figure 2I:
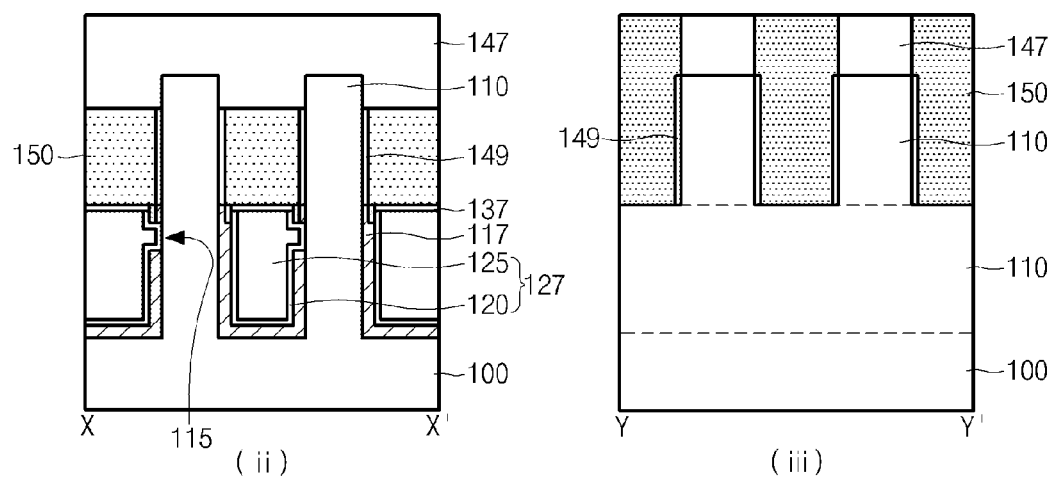

Referring to FIG. 2I, a gate conductive layer 150 is formed over the entire surface including the pillar pattern 110 and the third nitride layer 147. In this case, the gate conductive layer 150 is formed in such a manner that it is buried in an empty space between the pillar patterns 110 and a space between neighboring third nitride layers 147. The gate conductive layer 150 may be formed of titanium nitride (TiN), tungsten, or a combination thereof. In this case, if the gate conductive layer 150 is formed of TiN, a source gas may be $TiCl_4$, $TDMAT(Ti(N[CH_3]_2)_4)$ or a combination thereof. In accordance with another embodiment, if the gate conductive layer 150 is formed of tungsten, a thermal processing chemical vapor deposition (CVD) device may be used, and a source gas may be any one of $WF_6$, $B_2BH_6$, $H_2$ and $SiH_4$.

Thereafter, the gate conductive layer 150 is etched through a planarization process until the top surface of the third nitride layer 147 is exposed.

Figure 2J:
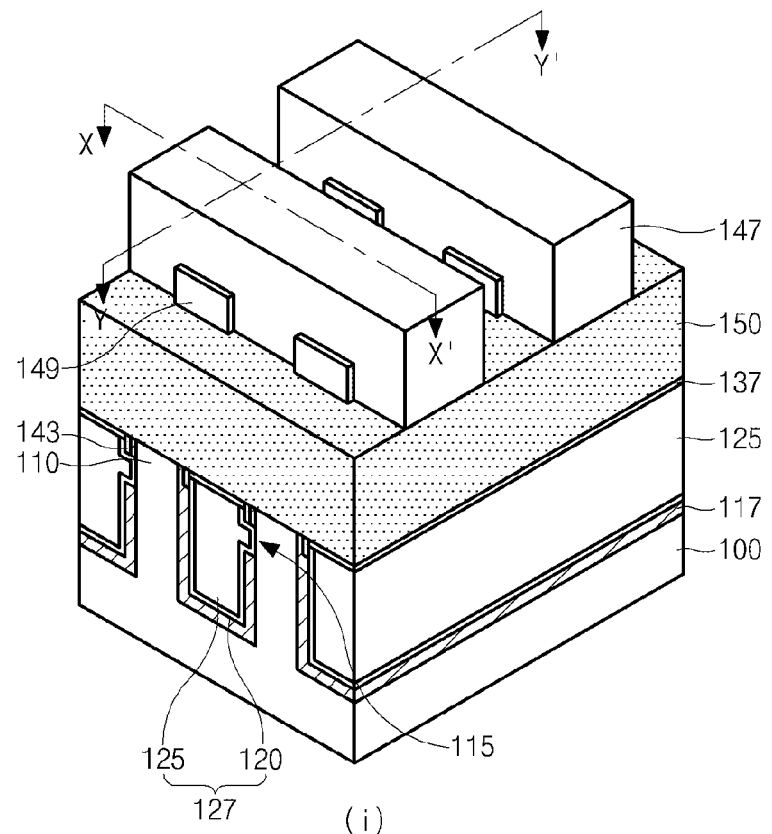
Figure 2J:
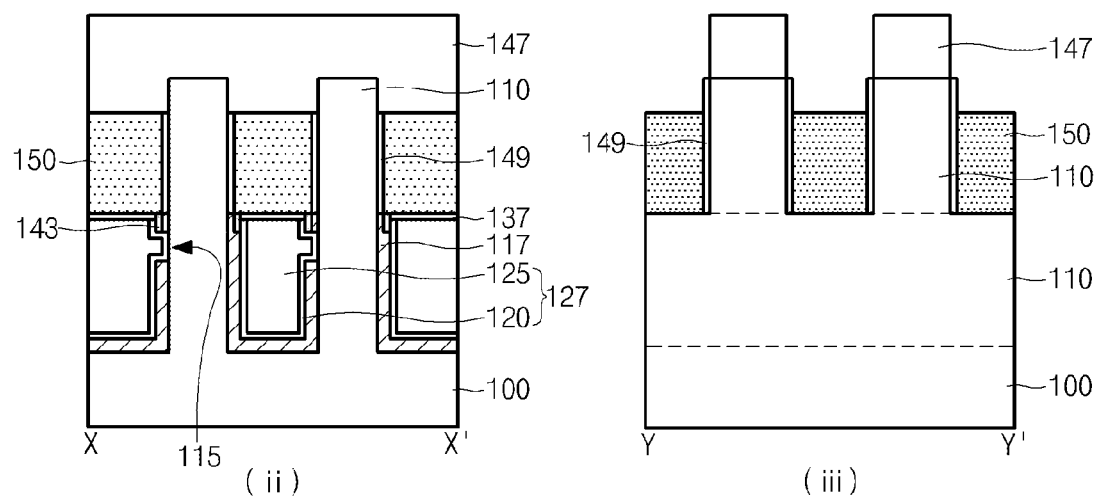

Referring to FIG. 2J, the gate conductive layer 150 is further etched by an etch-back process, so that the gate conductive layer 150 is recessed to a level corresponding to a bottom line of the third nitride layer 147.

Figure 2K:
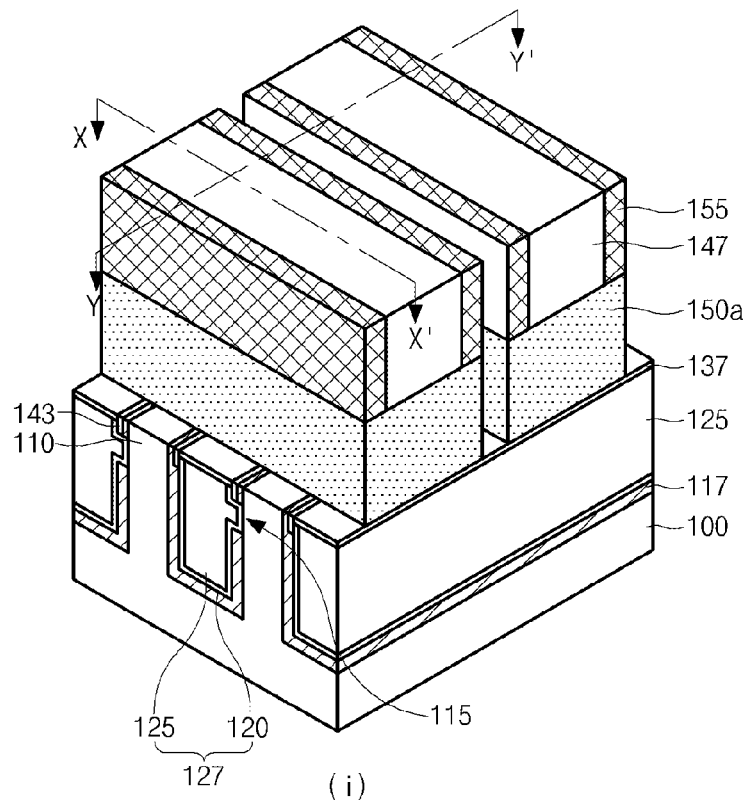
Figure 2K:
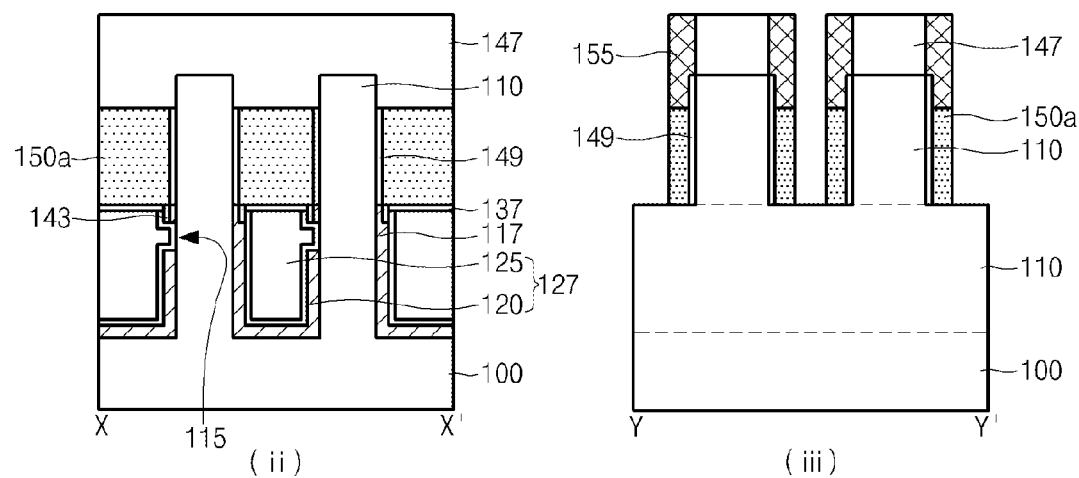

Referring to FIG. 2K, a spacer material layer is deposited over the entire surface including the pillar pattern 110 and the third nitride layer 147. The spacer material layer may be formed of a material including oxide.

An etch-back process is performed on the deposited spacer material layer, so that a spacer 155 is formed over sidewalls of the pillar pattern 110 and the third nitride layer 147. Thereafter, the gate conductive layer 150 is etched using the third nitride layer 147 and the spacer 155 as an etch mask until the top surface of the underlying layers beneath the gate conductive layer 150 is exposed, thereby forming a vertical gate 150a enclosing the sidewalls of the pillar pattern 110.

Figure 2L:
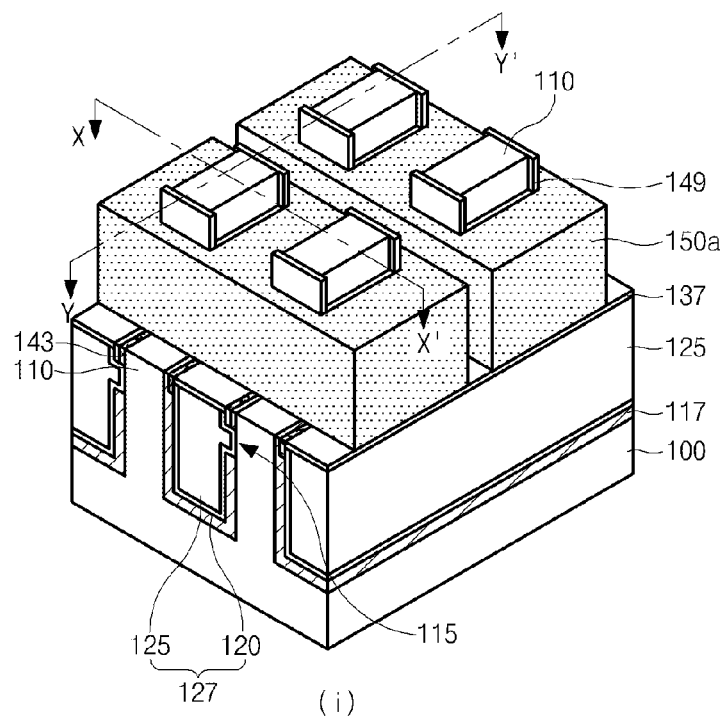
Figure 2L:
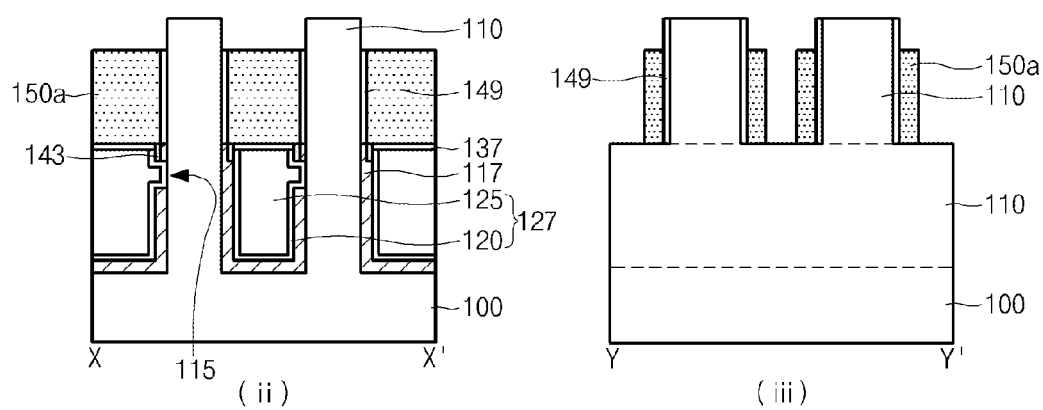

Then, referring to FIG. 2L, the third nitride layer 147 and the spacer 155 are removed, so that an upper portion of the pillar pattern 110 is exposed like an island. As a result, the vertical gate 150a is implemented to interconnect the pillar patterns 110 arranged along the X-X' direction crossing the bit line 127.

As apparent from the above description, the semiconductor device and the method for manufacturing the same according to embodiments of the present invention have the following effects. The pillar patterns 110 arranged in the direction crossing the buried bit line 127 are connected to each other through one vertical gate 150a. In this way, a structure for enabling the pillar patterns 110 to enclose the vertical gate 150a is formed, so that the following effects are obtained.

First, the present invention can guarantee sheet resistance Rs of the vertical gate.

Second, the present invention can maintain the height of the vertical gate at a predetermined level.

Third, the present invention can improve gate control capability using the vertical gate.

The above embodiments of the present invention are illustrative and not limitative. Various alternatives and equivalents are possible. The invention is not limited by the type of deposition, etching polishing, and patterning steps described herein. The invention is not limited to any specific type of a semiconductor device. For example, the present invention may be implemented in a dynamic random access memory (DRAM) device or a non volatile memory device. Other additions, subtractions, or modifications are obvious in view of the present disclosure and are intended to fall within the scope of the appended claims.

What is claimed is:

1. A method for manufacturing a semiconductor device, the method comprising:
   forming a plurality of first pillar patterns, each of which includes a sidewall contact, by selectively etching a semiconductor substrate;
   forming a buried bit line between two neighboring first pillar patterns;
   forming a plurality of second pillar patterns by selectively etching upper portions of the first pillar patterns; and
   forming a gate surrounding the plurality of second pillar patterns and arranged in a direction crossing the bit line.

2. The method according to claim 1, wherein the forming of the first pillar patterns includes:
   etching the semiconductor substrate in a line shape.

3. The method according to claim 1, further comprising:
   forming a barrier metal layer over the first pillar patterns and the semiconductor substrate.

4. The method according to claim 1, wherein the forming of the buried bit line includes:
   forming a bit line conductive layer over the semiconductor substrate including the first pillar patterns; and
   performing an etch-back process on the bit line conductive layer to be lower than the upper surface of the first pillar patterns.

5. The method according to claim 4, wherein the forming of the bit line conductive layer uses a material including tungsten or polysilicon, or a combination thereof.

6. The method according to claim 1, further comprising:
   forming a capping layer over the first pillar patterns and the buried bit line;
   burying a first oxide layer over the buried bit line arranged between the two neighboring first pillar patterns;
   removing the capping layer formed over sidewalls of the first pillar patterns;
   burying a second oxide layer in a space where the capping layer is removed;
   exposing the upper surface of the first pillar patterns by recessing the first and second oxide layers; and forming a nitride layer over the exposed first pillar patterns and the first and second oxide layers.

7. The method according to claim 6, wherein the capping layer includes a nitride layer.

8. The method according to claim 6, wherein the first or second oxide layer comprises a spin on dielectric (SOD) material.

9. The method according to claim 6, wherein the forming of the second pillar patterns includes:
forming a mask pattern crossing the buried bit line over the nitride layer and the first pillar patterns; and
selectively etching the nitride layer, the first and second oxide layers, and the first pillar patterns using the mask pattern as an etch mask to form the second pillar patterns and to form nitride patterns.

10. The method according to claim 9, wherein the mask pattern is formed perpendicular to the buried bit line.

11. The method according to claim 9, wherein the forming of the gate includes:
removing the first and second oxide layers remaining in a space between the second pillar patterns;
forming a gate conductive layer over the nitride patterns and a structure where the first and second oxide layers are removed so that sidewalls of the second pillar patterns are exposed and the capping layer is exposed;
removing the gate conductive layer disposed between the nitride patterns;
forming a spacer over sidewalls of the nitride patterns; and
etching the gate conductive layer using the spacer and the nitride patterns as a mask.

12. The method according to claim 11, further comprising:
forming a gate insulation layer over the sidewalls of the second pillar patterns before forming the gate conductive layer.

13. The method according to claim 11, wherein the gate conductive layer includes titanium nitride (TiN), tungsten, or a combination thereof.

14. The method according to claim 13, wherein the tungsten is processed by using a source gas selected from a group consisting of $WF_6$, $B_2BH_6$, $H_2$, $SiH_4$, and a combination thereof and a thermal processing chemical vapor deposition (CVD) device.

15. The method according to claim 13, wherein the titanium nitride (TiN) is processed using a source gas selected from a group consisting of $TiCl_4$, $TDMAT(Ti(N[CH_3]_2)_4)$, and a combination thereof.

* * * * *